United States Patent
Burger et al.

(10) Patent No.: US 10,565,182 B2
(45) Date of Patent: Feb. 18, 2020

(54) HARDWARE LZMA COMPRESSOR

(71) Applicant: Microsoft Technology Licensing, LLC, Redmond, WA (US)

(72) Inventors: Douglas C. Burger, Bellevue, WA (US); Scott Hauck, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1122 days.

(21) Appl. No.: 14/949,582

(22) Filed: Nov. 23, 2015

(65) Prior Publication Data
US 2017/0147624 A1    May 25, 2017

(51) Int. Cl.
*G06F 16/25* (2019.01)
*G06F 16/23* (2019.01)
*G06F 16/955* (2019.01)
*G06F 16/178* (2019.01)

(52) U.S. Cl.
CPC ...... *G06F 16/2365* (2019.01); *G06F 16/1794* (2019.01); *G06F 16/258* (2019.01); *G06F 16/955* (2019.01)

(58) Field of Classification Search
CPC .......... H03M 7/30–707; G06F 16/1794; G06F 16/2365; G06F 16/258; G06F 16/955
See application file for complete search history.

(56) References Cited

U.S. PATENT DOCUMENTS

| | | | |
|---|---|---|---|
| 7,492,290 B1 | 2/2009 | Schneider | |
| 8,279,096 B2 | 10/2012 | Novy | |
| 8,356,060 B2 | 1/2013 | Marwah et al. | |
| 8,694,474 B2 * | 4/2014 | Wu | G06F 16/00 707/693 |
| 2003/0033297 A1 * | 2/2003 | Ogawa | G06F 16/328 |
| 2005/0055367 A1 * | 3/2005 | Vo | H03M 7/30 |
| 2007/0154106 A1 | 7/2007 | Koziarz | |
| 2011/0161372 A1 | 6/2011 | Jones | |
| 2011/0320498 A1 * | 12/2011 | Flor | G06F 16/322 707/797 |
| 2013/0159811 A1 | 6/2013 | Biran et al. | |
| 2014/0068156 A1 | 3/2014 | Lee | |

(Continued)

FOREIGN PATENT DOCUMENTS

| | | |
|---|---|---|
| CN | 104199352 A | 12/2014 |
| CN | 104202054 A | 12/2014 |
| EP | 2715568 | 4/2014 |

OTHER PUBLICATIONS

International Search Report and Written Opinion dated Jan. 10, 2017 in International Patent Application No. PCT/US2016/061503, 12 pages.

(Continued)

*Primary Examiner* — Robert W Beausoliel, Jr.
*Assistant Examiner* — Nirav K Khakhar
(74) *Attorney, Agent, or Firm* — Watson Patents, PLC; Vladen M. Vasiljevic

(57) ABSTRACT

A system is provided that includes a first processor and a second processor. The first processor includes first hardware logic circuitry that performs a Lempel-Ziv-Markov chain algorithm (LZMA) forward pass compression process on a portion of source data to provide first output data. The second processor that performs an LZMA backward pass compression process on the first output data to provide second output data.

21 Claims, 13 Drawing Sheets

| HEAD TABLE 428a | | | | | | | | |
|---|---|---|---|---|---|---|---|---|
| TRIGRAM | $P_0$ | $P_1$ | $P_2$ | $P_3$ | $P_4$ | ... | $P_{N-2}$ | $P_{N-1}$ |
| abc | 0 | 4 | 11 | 19 | | | | |
| bc2 | 1 | 16 | | | | | | |
| c2a | 2 | 17 | | | | | | |
| 2ab | 3 | 18 | | | | | | |
| bc3 | 5 | 12 | 20 | 24 | | | | |
| c3d | 6 | 13 | 21 | 25 | | | | |
| 3de | 7 | 26 | | | | | | |
| def | 8 | | | | | | | |
| efa | 9 | | | | | | | |
| fab | 10 | | | | | | | |
| 3db | 14 | 22 | | | | | | |
| dbc | 15 | 23 | | | | | | |

(56) References Cited

U.S. PATENT DOCUMENTS

| | | | |
|---|---|---|---|
| 2014/0104085 A1 | 4/2014 | Cohen | |
| 2014/0115527 A1* | 4/2014 | Pepper | G06Q 10/10 715/781 |
| 2015/0178305 A1* | 6/2015 | Mueller | G06F 16/221 707/693 |
| 2016/0196277 A1* | 7/2016 | Lightner | G06F 16/24561 707/693 |

OTHER PUBLICATIONS

D. Salomon: "Data Compression: The complete Reference, Fourth Edition", 2004, Springer, XP002765241, 6 pages.

D. Salomon: "Data Compression: The Complete Reference", Jan. 1, 1998, XP002150106, 66 pages.

Bing, et al., English Abstract of "FPGA hardware implementation of the LZMA compression algorithm", In Journal of Beijing University of Aeronautics and Astronautics, vol. 41, Issue 3, Mar. 2015, pp. 375-382.

Li, et al., "Implementation of LZMA compression algorithm on FPGA", In Proceedings of Electronics Letters, vol. 50, Issue 21, Oct. 9, 2014, 2 pages.

Leavline, et al., "Hardware Implementation of LZMA Data Compression Algorithm", In International Journal of Applied Information Systems, vol. 5, No. 4, Mar. 2013, 6 pages.

Morales-Sandoval, et al., "On the Design and Implementation of an FPGA-based Lossless Data Compressor", Proceedings of 2004 International Conference on Reconfigurable Computing and FPGAs. Colima, Col., pp. 29-38. Sociedad Mexicana de Ciencias de la Computación. 2004.

Parekar, et al., "Hardware Implementation of Lossless LZMA Data Compression Algorithm", Progress in Science and Engineering Research Journal 13, vol. 02, Issue 03/06, May-Jun. 2014, pp. 201-205.

Abdelfattah, et al., "Gzip on a Chip: High Performance Lossless Data Compression on FPGAs using Open CL", IWOCL '14, May 12-13, 2014, 9 pages.

Agrawal, et al., "FPGA Based Implementation of Data Compression Using Dictionary Based "LZMA" Algorithm", Proceedings of 11th IRF International Conference, Jun. 15, 2014, 6 pages.

Abd El Ghany, et al., "Design and Implementation of FPGA-based Systolic Array for LZ Data Compression", InTech, Apr. 1, 2010, 19 pages.

* cited by examiner source    a b c 2 a b c 3 d e f a b c 3 d b c 2 a b c 2 a b c 3 d b c 3 d e ...
position  0 1 2 3 4 5 6 7 8 9 10 11 12 13 14 15 16 17 18 19 20 21 22 23 24 25 26 27 28 ...

| HEAD TABLE 428a | | | | | | | |
|---|---|---|---|---|---|---|---|
| TRIGRAM | $P_0$ | $P_1$ | $P_2$ | $P_3$ | $P_4$ | ... | $P_{N-2}$ | $P_{N-1}$ |
| abc | 0 | 4 | 11 | 19 | | | | |
| bc2 | 1 | 16 | | | | | | |
| c2a | 2 | 17 | | | | | | |
| 2ab | 3 | 18 | | | | | | |
| bc3 | 5 | 12 | 20 | 24 | | | | |
| c3d | 6 | 13 | 21 | 25 | | | | |
| 3de | 7 | 26 | | | | | | |
| def | 8 | | | | | | | |
| efa | 9 | | | | | | | |
| fab | 10 | | | | | | | |
| 3db | 14 | 22 | | | | | | |
| dbc | 15 | 23 | | | | | | |

FIG. 6B

| ID | TRIGRAM | $P_0$ | $P_1$ | $P_2$ | $P_3$ | $P_4$ | ... | $P_{N-2}$ | $P_{N-1}$ |
|---|---|---|---|---|---|---|---|---|---|
| 0020 | abc | 0 | 4 | 11 | 19 | | | | |
| 0020 | bc2 | 1 | 16 | | | | | | |
| 0020 | c2a | 2 | 17 | | | | | | |
| 0020 | 2ab | 3 | 18 | | | | | | |
| 0020 | bc3 | 5 | 12 | 20 | 24 | | | | |
| 0020 | c3d | 6 | 13 | 21 | 25 | | | | |
| 0020 | 3de | 7 | 26 | | | | | | |
| 0020 | def | 8 | | | | | | | |
| 0020 | efa | 9 | | | | | | | |
| 0020 | fab | 10 | | | | | | | |
| 0020 | 3db | 14 | 22 | | | | | | |
| 0020 | dbc | 15 | 23 | | | | | | |

HEAD TABLE 428b

FIG. 6C

| TRIGRAM | $P_0$ | $P_1$ | $P_2$ | $P_3$ | $P_4$ | ... | $P_{N-2}$ | $P_{N-1}$ |
|---|---|---|---|---|---|---|---|---|
| abc | 0 | 4 | 7 | 8 | | | | |
| bc2 | 1 | 15 | | | | | | |
| c2a | 2 | 15 | | | | | | |
| 2ab | 3 | 16 | | | | | | |
| bc3 | 5 | 7 | 8 | 4 | | | | |
| c3d | 6 | 7 | 8 | 4 | | | | |
| 3de | 7 | 19 | | | | | | |
| def | 8 | | | | | | | |
| efa | 9 | | | | | | | |
| fab | 10 | | | | | | | |
| 3db | 14 | 8 | | | | | | |
| dbc | 15 | 8 | | | | | | |

HEAD TABLE 428c

FIG. 6D

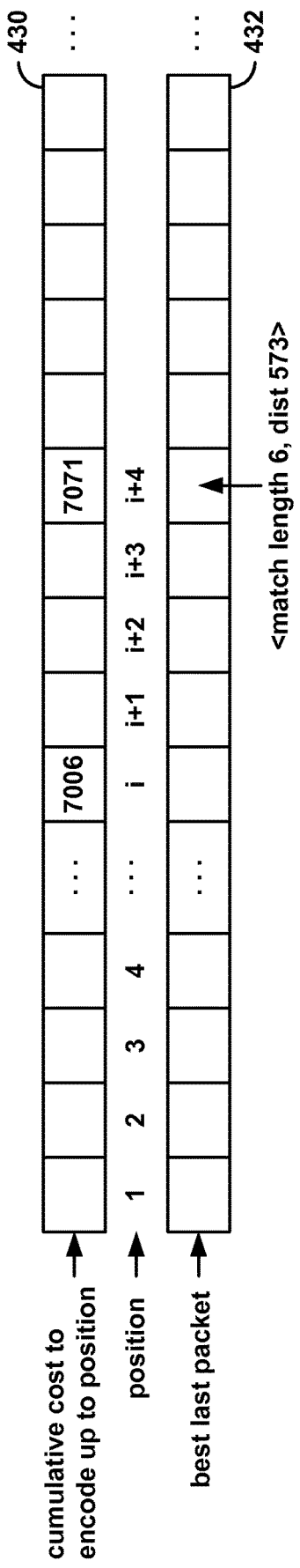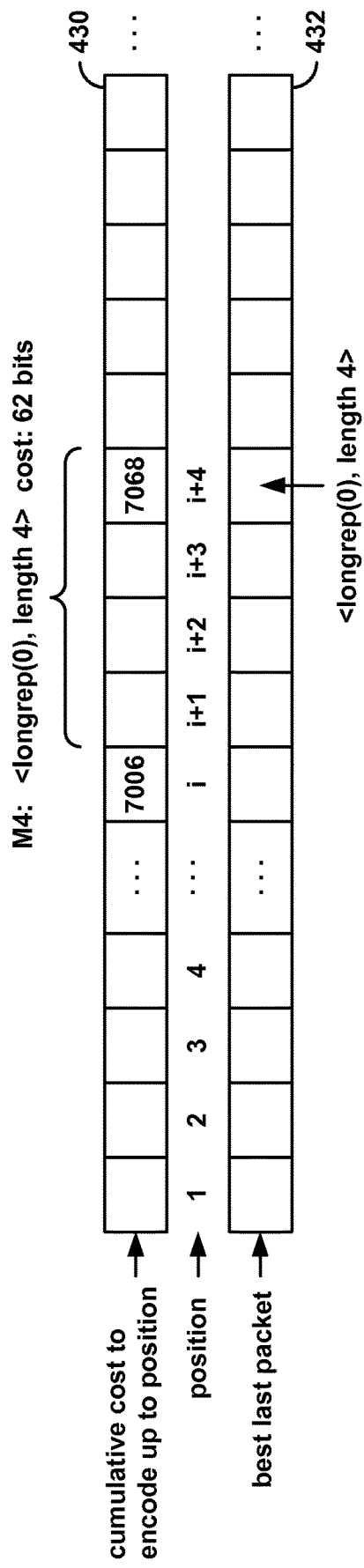

HARDWARE LZMA COMPRESSOR

BACKGROUND

As the speed and size of networked computer systems increases, the amount of data stored in and exchanged among such systems also increases. Although effort has been focused on developing larger and denser storage devices and faster networking technologies, continually increasing demand for storage space and networking bandwidth has led to the development of technologies that further optimize storage space and bandwidth currently available on existing storage devices and networks. One such technology is data compression, in which data are modified to reduce the number of bytes required to represent the data. Accordingly, data compression may reduce the size and bandwidth required to store and/or transmit data.

One data compression technique is the Lempel-Ziv-Markov chain algorithm (LZMA). The LZMA algorithm includes a Lempel-Ziv front-end and a Range Encoder back-end. The Lempel-Ziv front-end looks for repetitions in the incoming file, and replaces repetitions with short pointers to the previous occurrence of that text. The Range Encoder encodes the individual bits and bytes using the statistics and likelihoods of individual values within the file. LZMA algorithms typically are implemented in software.

SUMMARY

According to a first aspect, a system is provided that includes a first processor and a second processor. The first processor includes first hardware logic circuitry that performs an LZMA forward pass compression process on a portion of source data to provide first output data. The second processor that performs an LZMA backward pass compression process on the first output data to provide second output data.

According to a second aspect, a computing device is provided that includes a hardware accelerator that includes hardware logic circuitry that performs an LZMA forward pass compression process on a portion of source data. The hardware accelerator includes a head table processor that includes hardware logic circuitry that identifies trigrams in the portion of source data, and maintains in a memory a head table including the N most recent occurrences of each identified trigram.

According to a third aspect, a method is provided that includes using first hardware logic circuitry to perform an LZMA forward pass compression process on a portion of source data to provide first output data, using second hardware logic circuitry to perform an LZMA backward pass compression process on the first output data to provide second output data, and using third hardware logic circuitry to perform a range encoder process or a Huffman encoder process on the second output data to provide compressed output data.

The above-summarized functionality can be manifested in various types of systems, devices, components, methods, computer readable storage media, data structures, graphical user interface presentations, articles of manufacture, and so on.

This Summary is provided to introduce a selection of concepts in a simplified form; these concepts are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

FIG. 6A is an illustration of an example portion of source data.

FIGS. 6B-6D are diagram illustrating example implementations of head tables corresponding to the portion of source data of FIG. 6A.

FIGS. 10A-10B are diagrams illustrating an example operation of dynamic program table processor of FIGS. 4A-4B.

Figure 1:
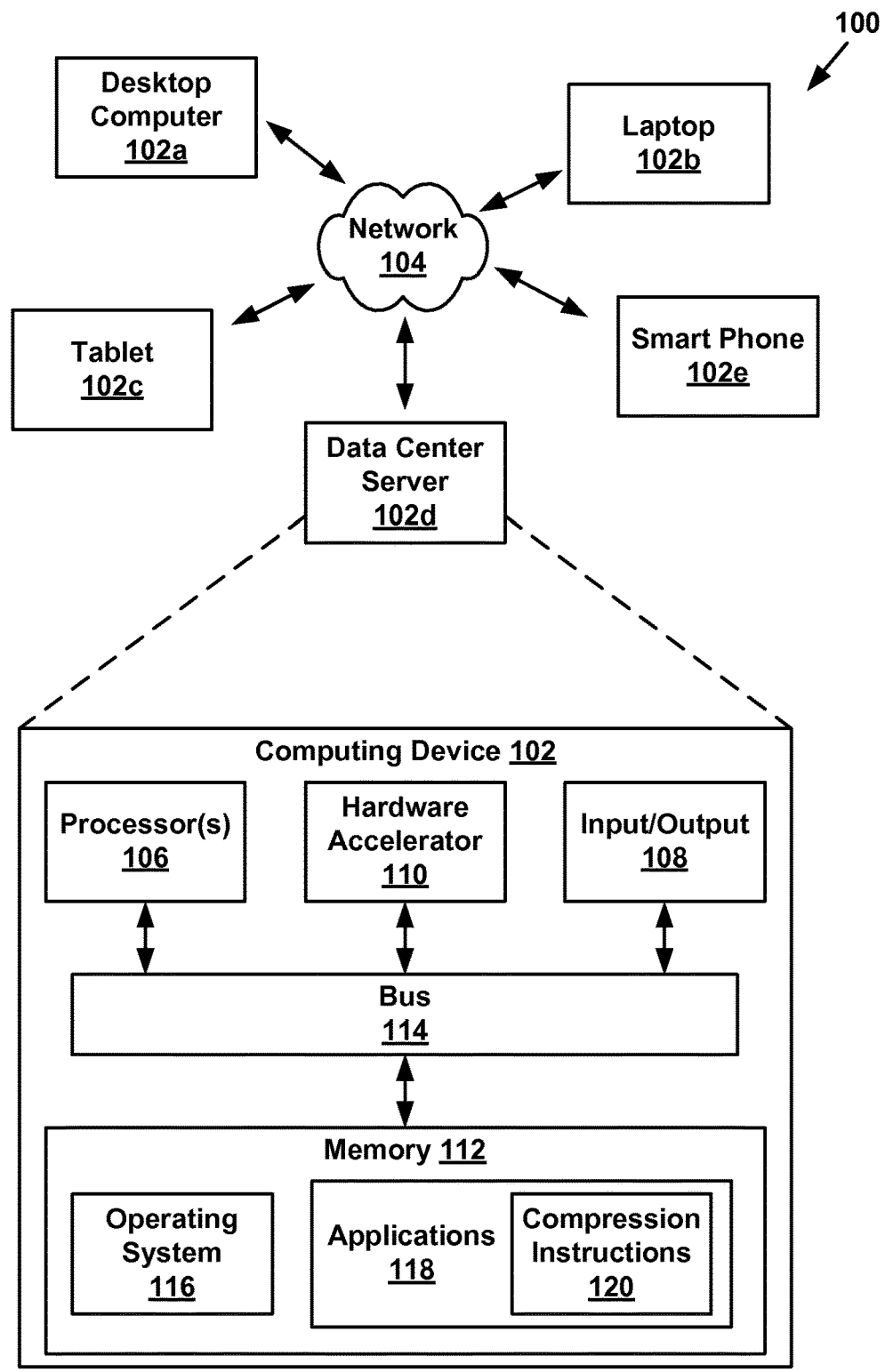
FIGS. 1-3 are block diagrams depicting example environments in which techniques described herein may be implemented.

The same numbers are used throughout the disclosure and figures to reference like components and features. Series 100 numbers refer to features originally found in FIG. 1, series 200 numbers refer to features originally found in FIG. 2, series 300 numbers refer to features originally found in FIG. 3, and so on.

DETAILED DESCRIPTION

Software LZMA compressors can achieve very high compression quality, but the time required to perform the compression can be long, limiting the application of LZMA. Technology is described for hardware implemented LZMA compression engines that may reduce compression time while maintaining compression quality.

As described in more detail below, technology is described for LZMA compression engines that include a front end processor and a back end processor. In an implementation, the front end processor and back end processor are both implemented in one or more hardware accelerators, such as one or more field-programmable gate array (FPGA) devices. In other implementations, the front end processor is implemented in one or more hardware accelerators and the back end processor is implemented in software. In an implementation, LZMA compression engines are implemented in one or more hardware accelerators in a data center environment.

In an implementation front end processor includes a first processor and a second processor. In an implementation, the first processor includes hardware logic circuitry configured to perform an LZMA forward pass compression process on portions of source data to provide first output data, and the second processor includes logic configured to implement an LZMA backward pass compression process on the first output data. The first processor operates in parallel with the second processor to achieve a more efficient hardware LZMA implementation.

As a preliminary matter, some of the figures describe concepts in the context of one or more structural components, variously referred to as functionality, modules, features, elements, etc. The various components shown in the figures can be implemented in any manner by any physical and tangible mechanisms, for instance, by software running on computer equipment, hardware (e.g., chip-implemented logic functionality), etc., and/or any combination thereof.

In one case, the illustrated separation of various components in the figures into distinct units may reflect the use of corresponding distinct physical and tangible components in an actual implementation. Alternatively, or in addition, any single component illustrated in the figures may be implemented by more than one actual physical component. Alternatively, or in addition, the depiction of any two or more separate components in the figures may reflect different functions performed by a single actual physical component.

Other figures describe concepts in flowchart form. In this form, certain operations are described as constituting distinct blocks performed in a certain order. Such implementations are illustrative and non-limiting. Certain blocks described herein can be grouped together and performed in a single operation, certain blocks can be broken apart into multiple component blocks, and certain blocks can be performed in an order that differs from that which is illustrated herein (including a parallel manner of performing the blocks). Blocks shown in the flowcharts can be implemented in any manner by any physical and tangible mechanisms, for instance, by software running on computer equipment, hardware (e.g., chip-implemented logic functionality), etc., and/or any combination thereof.

As to terminology, the phrase "configured to" encompasses any way that any kind of physical and tangible functionality can be constructed to perform an identified operation. The functionality can be configured to perform an operation using, for instance, software running on computer equipment, hardware (e.g., chip-implemented logic functionality), etc., and/or any combination thereof.

The term "logic" encompasses any physical and tangible functionality for performing a task. For instance, each operation illustrated in the flowcharts corresponds to a logic component for performing that operation. An operation can be performed using, for instance, software running on computer equipment, hardware (e.g., chip-implemented logic functionality), etc., and/or any combination thereof. When implemented by computing equipment, a logic component represents an electrical component that is a physical part of the computing system, however implemented.

The following explanation may identify one or more features as "optional." This type of statement is not to be interpreted as an exhaustive indication of features that may be considered optional. That is, other features can be considered as optional, although not explicitly identified in the text. Further, any description of a single entity is not intended to preclude the use of more than one such entity. Similarly, a description of multiple entities is not intended to preclude the use of a single entity. Further, although the description may explain certain features as alternative ways of carrying out identified functions or implementing identified mechanisms, the features also can be combined together in any combination. Finally, the terms "exemplary" or "illustrative" refer to an implementation among potentially many implementations.

FIG. 1 illustrates an example environment 100 in which example processes involving data compression as described herein can operate. In some examples, the various devices and/or components of environment 100 include a variety of computing devices 102. By way of example and not limitation, computing devices 102 may include devices 102a-102e. Although illustrated as a diverse variety of device types, computing devices 102 can be other device types and are not limited to the illustrated device types. In some implementations any of a number of computing devices 102 may be interconnected via a network 104.

Network 104 can include, but is not limited to, a cellular network (e.g., wireless phone), a point-to-point dial up connection, a satellite network, the Internet, a local area network, a wide area network, a WiFi network, an ad hoc network, an intranet, an extranet, or a combination thereof. Network 104 may include one or more connected networks (e.g., a multi-network environment). Network 104 may include one or more data centers that store and/or process information (e.g., data) received from and/or transmitted to computing devices 102.

In an implementation, computing devices 102 can comprise any type of device with one or multiple processors 106 operably connected to an input/output interface 108, a hardware accelerator 110, and a memory 112, e.g., via a bus 114. Computing devices 102 can include personal computers such as, for example, desktop computers 102a, laptop computers 102b, tablet computers 102c, data center servers 102d (or servers is any other environment), smart phones 102e, electronic book readers, wearable computers, automotive computers, gaming devices, etc. In an implementation, computing devices 102 need not include processor 106, and may be a hardware appliance.

Computing devices 102 also can include other computing devices such as, for example, server computers, thin clients, terminals, and/or work stations. In some examples, computing devices 102 can include, for example, components for integration in a computing device, appliances, or other sorts of devices.

In some examples, some or all of the functionality described as being performed by computing devices 102 may be implemented by one or more remote peer computing devices, a remote server or servers, or a cloud computing resource. In some examples, a computing device 102 may include an input port to receive an input data sequence. Computing device 102 may further include one or multiple processors 106 to perform a hardware data compression process, for example.

In some examples, as shown regarding device 102d, memory 112 can store instructions executable by the processor(s) 106 including an operating system 116, and programs or applications 118 that are loadable and executable by processor(s) 106. Applications 118 may include compression instructions 120 that may be executed to operate hardware accelerator 110, for example. The one or more processors 106 may include one or more central processing units (CPUs), graphics processing units (GPUs), video buffer processors, and so on.

In some implementations, compression instructions 120 include executable code stored in memory 112 and are executable by processor(s) 106 to receive and compress data sequences (e.g., streaming data or data files), locally or remotely by computing device 102, via input/output 108. In some examples, the data sequences may be associated with one or more applications 118. Compression instructions 118 may operate in combination with hardware accelerator 110 to apply any of a number of processes used to compress data stored in memory 112 or received via input/output 108.

Although certain blocks have been described as performing various operations, the modules are merely examples and the same or similar functionality may be performed by a greater or lesser number of modules. Moreover, the functions performed by the modules depicted need not necessarily be performed locally by a single device. Rather, some operations could be performed by a remote device (e.g., peer, server, cloud, etc.).

Alternatively, or in addition, some or all of the functionality described herein can be performed, at least in part, by one or more hardware logic circuits. For example, and without limitation, illustrative types of hardware logic circuits that can be used include an FPGA device, an application-specific integrated circuit (ASIC) device, a GPU, a massively parallel processor array (MPPA) device, an application-specific standard product (ASSP) device, a system-on-a-chip device (SOC) device, a complex programmable logic device (CPLD), a custom integrated circuit, etc.

For example, all or a portion of hardware accelerator 110 may be implemented on one or more FPGAs, ASICs, GPUs, MPPAs, ASSPs, SOCs, CPLDs, and/or custom integrated circuits. The term "hardware" accelerator broadly encompasses different ways of leveraging a hardware device to perform a function, including, for instance, at least: a) a case in which at least some tasks are implemented in hard ASIC logic or the like; b) a case in which at least some tasks are implemented in soft (configurable) FPGA logic or the like; c) a case in which at least some tasks run as software on FPGA software processor overlays or the like; d) a case in which at least some tasks run on MPPAs of soft processors or the like; e) a case in which at least some tasks run as software on hard ASIC processors or the like, and so on, or any combination thereof.

The following explanation will present a primary example in which hardware accelerators, such as hardware accelerator 110, correspond to one or more FPGA devices, although, as noted, hardware accelerators may be constructed using other types of hardware logic circuits.

Computer readable media may include computer storage media and/or communication media. Computer storage media includes volatile and non-volatile, removable and non-removable media implemented in any method or technology for storage of information such as computer readable instructions, data structures, program modules, or other data. Computer storage media includes, but is not limited to, phase change memory (PRAM), static random-access memory (SRAM), dynamic random-access memory (DRAM), other types of random-access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device.

In contrast, communication media embodies computer readable instructions, data structures, program modules, or other data in a modulated data signal, such as a carrier wave, or other transmission mechanism. As defined herein, computer storage media does not include communication media. In various examples, memory 112 is an example of computer storage media storing computer-executable instructions.

In various examples, an input device of input/output interface 108 can be a direct-touch input device (e.g., a touch screen), an indirect-touch device (e.g., a touch pad), an indirect input device (e.g., a mouse, keyboard, a camera or camera array, etc.), or another type of non-tactile device, such as an audio input device.

Computing device(s) 102 also may include one or more input/output interfaces 108 to allow computing device 102 to communicate with other devices. Input/output interface 108 can include one or more network interfaces to enable communications between computing device 102 and other networked devices such as other device(s) 102. Input/output interface 108 can allow a computing device 102 to communicate with other devices such as user input peripheral devices (e.g., a keyboard, a mouse, a pen, a game controller, a voice input device, a touch input device, gestural input device, and the like) and/or output peripheral devices (e.g., a display, a printer, audio speakers, a haptic output, and the like).

Figure 2:
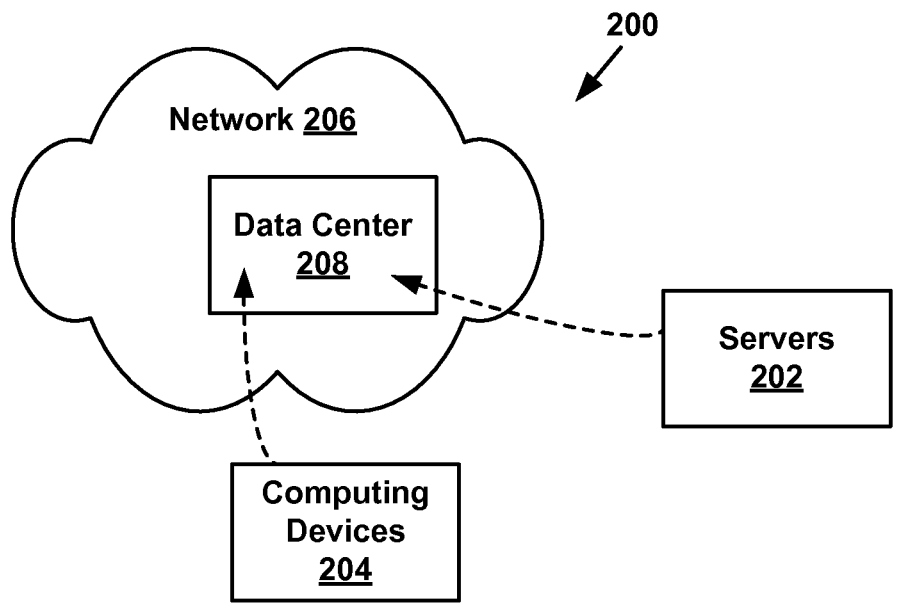

FIG. 2 is a block diagram depicting an example system 200 that includes any number of servers 202 and computing devices 204 in communication with a network 206. At least a portion of servers 202 and/or computing devices 204 are located in one or more data centers 208, as indicated by the dashed arrows. Such communication, for example, may involve transmitting and/or receiving data among servers 202, computing devices 204, and data center 208 via network 206 at relatively fast network rates. For example, data received in data center 208 may include network data traffic via the Internet (e.g., network 206), for example. Such data may be received by the data center at network speeds that exceed 10 Gb/sec, for example.

Individual servers 202 and computing devices 204, for example, may be the same as or similar to computing device 102 described above and illustrated in FIG. 1. Network 206 may the same as or similar to network 104, for example, described in FIG. 1. In some examples, data center 208 is a facility used to house computer systems and associated components, such as telecommunications and storage systems. Such a data center may include, among other things, redundant or backup power supplies, redundant data communications connections, environmental controls (e.g., air conditioning, fire suppression), and various security devices. Data centers may involve industrial-scale operations and relatively large amount of electrical power for supporting operations.

Figure 3:
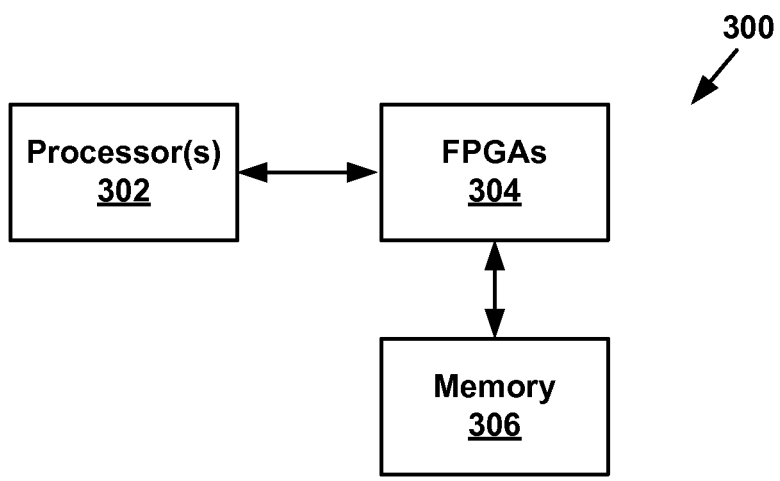

FIG. 3 is a block diagram depicting an example system 300 that includes any number of processors 302 and FPGAs 304. System 300, which may be incorporated in a data center (e.g., data center 208 of FIG. 2) for example, may be similar to or the same as computing device 102 described above and illustrated in FIG. 1. System 300 may be configured to compress data that are received into the data center or transmitted from the data center. In some implementations, such data may be transmitted through FPGAs 304, for example. FPGAs 304 may directly communicate with memory 306, which may store data during compression processes performed with FPGAs 304.

In some examples, FPGAs 304 may be the same as or similar to hardware accelerator 110 described above and illustrated in FIG. 1. In various implementations, system 300 may include any number of ASICs, GPUs, MPPAs, ASSPs, SOCs, CPLDs, custom integrated circuits, or a combination thereof, in addition to or in place of FPGAs 304. In other words, for example, data compression described herein may be implemented using any of a number of hardware configurations, such as those listed above.

Figure 4A:
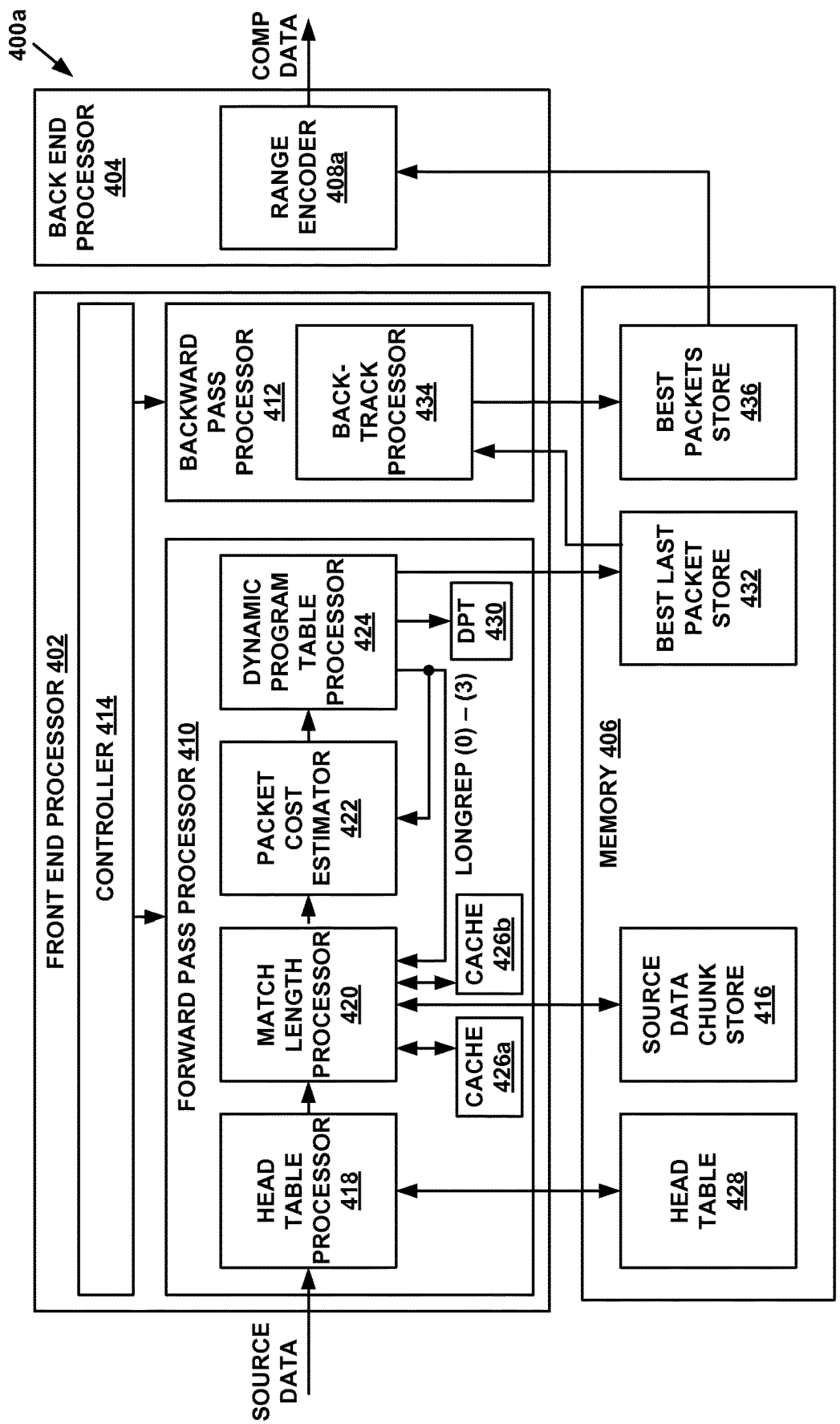
FIGS. 4A-4B are block diagrams of example hardware-implemented compression engines.

FIG. 4A is a block diagram of an implementation of a compression engine 400a that includes a front end processor 402a, back end processor 404 and a memory 406. In an implementation, front end processor 402 is implemented in a hardware accelerator, such as hardware accelerator 110 of FIG. 1. Back end processor 404 also may be implemented in a hardware accelerator, such as hardware accelerator 110 of FIG. 1, or may be implemented in software, such as on one or more of processor(s) 106 of FIG. 1.

Memory 406 may be DRAM, SRAM, hard drive, solid state drive, optical drive, or other memory device or any combination thereof. Memory 406 may include one or more memory devices. Some or all of memory 406 may be included (e.g., in on-chip embedded RAM) in front end processor 402, back end processor 404, or any combination thereof.

LZMA algorithms typically are used to compress text files. Thus, source data may include multiple bytes of data, with each byte representing a text character (e.g., "a," "b," "8," and so on). LZMA algorithms also may be used to compress non-text data. The technology described herein may be used to compress any type of source data, including text, audio, video or other data.

In an implementation, front end processor 402 includes logic to receive source data (e.g., data to be compressed), perform Lempel-Ziv (LZ) front end compression on source data to form LZMA packets, and store the LZMA packets in memory 406. As described in more detail below, front end processor 402 includes logic that seeks to encode source data using a set of LZMA packets that result in a smallest possible compressed file at the output of back end processor 404. In particular, front end processor 402 looks for repetitions in the source data, and replaces repetitions with short pointers to the previous occurrence of that text.

In an implementation, back end processor 404 includes logic to compress the LZMA packets to provide compressed data. In an implementation, back end processor 404 includes logic to implement a range encoder 408a. Range encoder 408a encodes the individual bits and bytes of the LZMA packets using the statistics and likelihoods of individual values within the file Range encoding is equivalent to Arithmetic Coding. Range encoding keeps track of the likelihood of a given bit in the encoding being a TRUE or a FALSE, and uses those statistics to shrink the size of the encoding. For example, if a bit is known from previous data encoded in the file to likely be a specific value, then if the bit actually is that value the bit can be encoded in less than a full bit's worth of information. Alternatively, if the bit is not that value the bit may take more than a full bit of the encoding to represent. Thus, for a file where these predictions are correct, the data size can be significantly reduced.

Figure 4B:
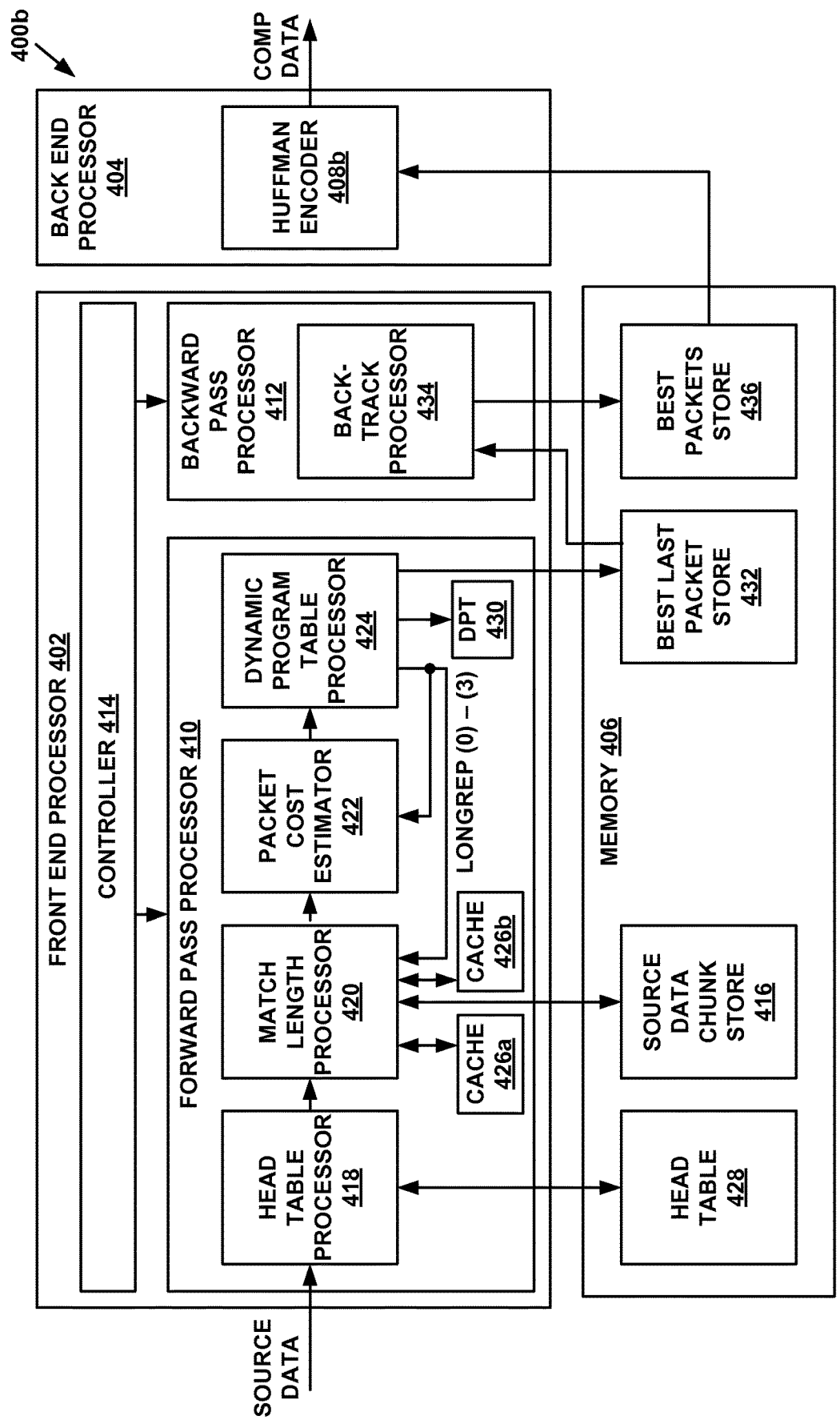

Back end processor 404 alternatively may include logic to implement other back end encoders. For example, FIG. 4B is a block diagram of an example compression engine 400b in which back end processor 404 includes logic to implement a Huffman encoder 408b. Huffman encoding attempts to reduce the size of files by representing common occurrences with shorter codewords, thus achieving an overall smaller file size. Huffman encoder 408b may use predefined trees, such that all files that represent a given value use the same encoding. Such encoding is referred to herein as "static Huffman." Alternatively, Huffman encoder 408b may use dynamically created Huffman trees, which compute the trees to use for a given file or file region based on the statistics of that data, and then transmit the Huffman trees to the decoder. Such encoding is referred to herein as "dynamic Huffman."

In other embodiments, back end processor 404 may include logic to implement multiple back end encoders, and may include logic to selectively use one of the multiple range encoders to encode the individual bits and bytes of the LZMA packets provided by front end processor 402 based on a variety of criteria, such as characteristics of the source data, or other criteria.

Front end processor 402 includes a first (forward pass) processor 410 and a second (backward pass) processor 412, each coupled to a controller 414. In an implementation, forward pass processor 410 includes first hardware logic circuitry configured to perform an LZMA forward pass compression process on portions of source data (referred to herein as "chunks") to provide first output data. The first output data are "best last" (lowest cost) LZMA packets for each byte position in the chunk. In an implementation, forward pass processor 410 maintains in memory a table that specifies for each byte in the chunk the best final packet to encode the chunk up to that byte. In an implementation, each chunk may be between about 2 MB and about 8 MB of source data, although other chunk sizes may be used.

In an implementation, backward pass processor 412 includes logic to implement an LZMA backward pass "backtrack" compression process on the "best last" (lowest cost) LZMA packets to provide second output data. The second output data are "best" (lowest cost) overall encoding of the source data. In particular, backward pass processor 412 starts at the end of the table created by forward pass processor 410, uses the best final packet to encode the last byte of the chunk, finds the length L of that packet, and backtracks L bytes to the next byte to be encoded, and repeats this process in an iterative manner to the beginning of the chunk. Backward pass processor 412 may be implemented in hardware and/or software. In an implementation, backward pass processor 412 includes second hardware logic circuitry configured to implement an LZMA backward pass compression process on the first output data.

In an implementation, under the operation of controller 414, these processes iterate, with forward pass processor 410 processing a chunk of source data, and backward pass processor 412 performing backtrack processing on the processed chunk data, until all source data have been processed. In an implementation, forward pass processor 410 and backward pass processor 412 operate in parallel, so that forward pass processor 410 can start on a next chunk of source data while backward pass processor 412 operates on the current chunk of source data. Without wanting to be bound by any particular theory, it is believed that splitting front end processing in this manner between forward pass processor 410 and backward pass processor 412 may eliminate some sequential processing that occurs in software LZMA compressors.

Back end processor 404, also referred to herein as a third processor, is configured to perform a range encoder process or a Huffman encoder process on the second output data provided by backward pass processor 412 to provide compressed output data.

Figure 5:
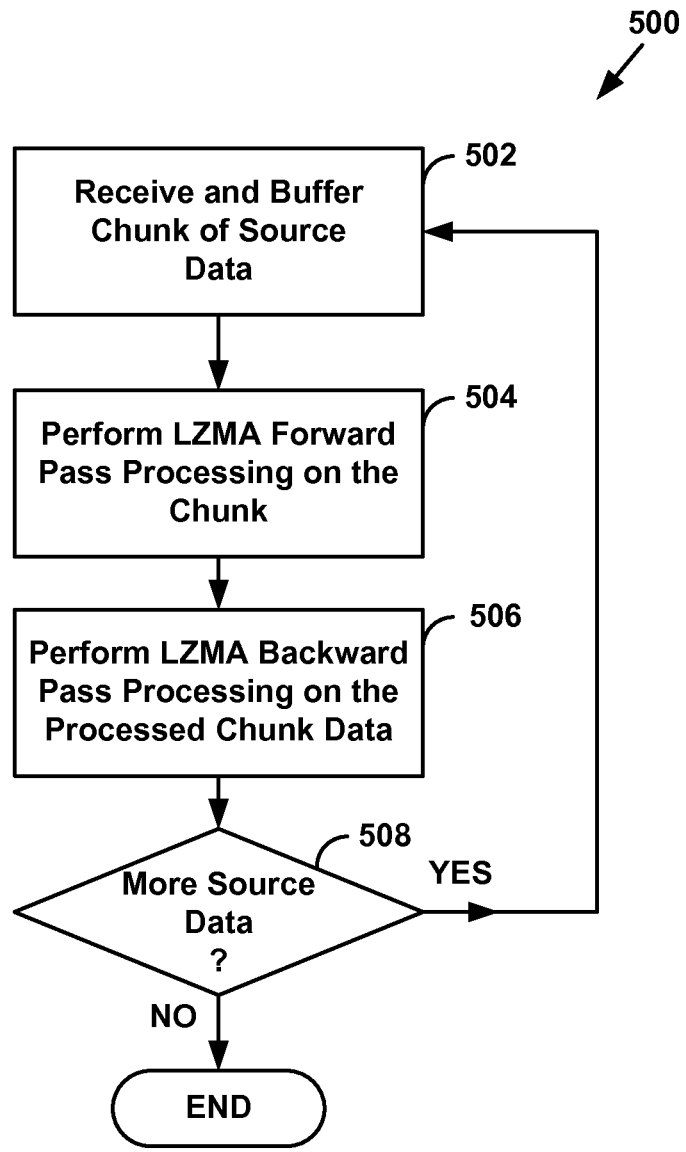
FIG. 5 is a flowchart that shows one manner of operation of a front end processor of the compression engines of FIGS. 4A-4B.

FIG. 5 illustrates a process 500 that shows one manner of operation of front end processor 402. In block 502, controller 414 receives and buffers a chunk of source data. In an implementation, controller 414 stores the received chunk in a source data chunk store 416 in memory 406.

In block 504, forward pass processor 410 processes the chunk to provide best last (lowest cost) LZMA packets for each byte position in the chunk.

In block 506, backward pass processor 412 performs a backtrack process to produce the "best" (lowest cost) overall encoding of the source data. In particular, backward pass processor 412 starts at the end of the table created by forward pass processor 410, uses the best final packet to encode the last byte of the chunk, finds the length L of that packet, and backtracks L bytes to the next byte to be encoded, and repeats this process in an iterative manner to the beginning of the chunk.

In block 508, controller 414 determines if any more source data are to be compressed. If more source data are available, the process returns to block 502, and controller 414 receives and buffers a next chunk of source data. If at block 508 no more source data are to be compressed, process 500 ends. Persons of ordinary skill in the art will understand that the steps of process 500 may be pipelined to run multiple steps in parallel, on different chunks of source data.

Front end processor 402 encodes one or more bytes of source data as LZMA packets. LZMA includes at least three different packet types: LIT, MATCH and LONGREP. Each of these will be discussed in turn.

A LIT packet is the simplest type. A LIT packet contains the raw character literally. To encode the LIT packet back end processor 404 must encode a LIT header (information indicating the packet type), plus the entire raw character.

A MATCH packet represents the encoding of a repeated portion of text. A MATCH packet includes a MATCH header (information indicating the packet type), a length field, which says how many bytes of the source file are represented by this single MATCH packet, and a distance field that indicates where in the source file to find an earlier copy of this repeated portion. A distance 0 means the character position 1 before the start of the repeated portion, and a distance i means the character position (i+1) before the start of the repeated portion.

For example, assume that a file includes the characters "abcabc" to be encoded. This file can be encoded via the stream of packets <LIT: a>, <LIT: b>, <LIT: c>, <MATCH length: 3, dist: 2>. The three LIT packets represent the first three characters ("abc") in the file, and the MATCH packet represents the last three characters in the file (the second "abc"). Because "abc" includes 3 characters, the length is 3. The distance is 2, because the previous occurrence of "abc" is 3 positions earlier in the file, and a distance of i means (i+1) positions earlier in the file.

Note that for back end processor 404 to encode a MATCH packet, the MATCH header must be encoded, plus the length field, plus the distance field. Although back end processor 404 can use a variable-length encoding for the numeric field (i.e., smaller values will generally result in shorter codes), the numbers will generally take up noticeable space in the output encoding, and larger distance values will generally result in longer encodings.

LONGREP packets are more efficient versions of MATCH packets, but are usable only in specific situations. An LZMA encoder and an LZMA decoder each maintain a list of the four most-recently used distance fields from MATCH and LONGREP packets. LONGREP(0) is the most recently used distance field. LONGREP(1) is the second most recently used distance field, LONGREP(2) is the third most recently used distance field, and LONGREP(3) is the fourth most recently used distance field.

Thus, if a file has been encoded with: <MATCH length: 3 dist: 12>, <LIT: a>, <MATCH length: 5 dist: 4>, <MATCH length: 6 dist: 59>, <MATCH length: 4 dist: 19>, then the most recently used distance fields are 0:19, 1:59, 2:4, 3:12.

When front end processor 402 produces a LONGREP(i) packet, front end processor 402 sends the length field, but instead of also sending the distance, front end processor 402 instead implicitly reuses the ith most recently sent distance field. Thus, in the previous example instead of issuing another <MATCH length: 7 dist: 59>, front end processor 402 can instead issue <LONGREP(1) length: 7>, because the distance of 59 is the second most-recently used distance. Similarly, a LONGREP(0) packet at the same position would have an implicit distance of 19, a LONGREP(2) packet would have an implicit distance of 4, and a LONGREP(3) packet would have an implicit distance of 12.

An LZMA encoder and decoder each maintain a set of recently used distance fields as a stack, initialized to all zeros. When a new MATCH packet is encountered all of the current values are shifted down, and the new value is added into position 0. In contrast, if a LONGREP(i) packet is encountered, that value is moved to position 0, and the other values are shifted as needed to make room for that new value.

For every LONGREP(i) packet, there is a corresponding MATCH packet that could be used. However, the advantage of a LONGREP packet is that by not explicitly transmitting the distance field, a LONGREP packet is generally encoded shorter than the corresponding MATCH packet.

As described above, forward pass processor 410 processes source data in chunks to provide best (lowest cost) last LZMA packets for each byte of data in the chunk. In an implementation, forward pass processor 410 includes a head table processor 418, a match length processor 420, a packet cost estimator 422, a dynamic program table processor 424, an optional first cache 426a, an optional second cache 426b, and a dynamic program table 430. Optional first cache 426a and second cache 426b may be a single cache or may be separate cache.

Head table processor 418 receives a chunk of source data, and includes logic to identify trigrams in the chunk, one position (byte) at a time, and save the most recent N occurrences (positions) of each trigram in a head table 428, which is stored in memory 406. As used herein, a trigram is a set of three consecutive bytes in a chunk. In an implementation, N may have values between 4 and 66, although other N values may be used. In implementations, head table 428 may have a size between about 2 GB to about 6 GB, although other sizes may be used.

As head table processor 418 processes the chunk, head table processor 418 identifies the trigram at each position. If an identified trigram is not listed in head table 428, head table processor 418 adds an entry in head table 428 for the identified trigram and enters the corresponding position of the identified trigram. If an identified trigram is already in head table 428, head table processor 418 saves the corresponding position of the identified trigram in head table 428. If N positions have already been saved in head table 428 for the trigram, head table processor 418 deletes the oldest occurrence, and adds the new occurrence to head table 428.

In an embodiment, head table 428 has an array data structure, such as a list of the N most recent occurrences of each trigram. Such a data structure allows bulk transfers (e.g., bulk reads and bulk writes) of data from memory 406 to head table processor 418, which may be performed faster in hardware than a sequential data structure that typically is used for a head table in software implementations of an LZMA compressor. By not using a sequential data structure for head table 428, access times may be reduced, and opportunities for parallel processing may be provided.

FIG. 6A illustrates example data in a chunk 600, and FIG. 6B illustrates an example head table 428a corresponding to chunk 600. Head table 428a includes a column "TRI-GRAM" for storing a list of trigrams in chunk 600, and columns $P_0, P_1, \ldots, P_{N-2}, P_{N-1}$ for storing the corresponding N most recent positions for each trigram in chunk 600. In the illustrated example, the first trigram "abc" is at positions 0, 4, 11 and 19, the second trigram "bc2" is at positions 2 and 16, the third trigram "c2a" is at positions 2 and 17, and so on. If all N columns for a given trigram are full, head table processor 418 discards the oldest occurrence of the trigram (i.e., the position listed in column $P_0$), shifts all position data one column to the left, and enters the newly identified trigram position in column $P_{N-1}$.

Persons of ordinary skill in the art will understand that if each possible trigram is given a unique location in memory, the trigram itself does not need to be stored. Thus, instead of adding a new line in head table 428a as each unique trigram is found, a unique memory location is identified for each possible trigram.

As described above, in some implementations, N may have values between 4 and 66, although other N values may be used. As described in more detail below, as N increases, compression quality increases, and compression rate decreases. In an embodiment, N may have a fixed value (e.g., N=66) for all source data. In other embodiments, N may have a user-selectable value that may be used to provide multiple compression modes. For example, a user may specify a first N value (e.g., N=4) to provide a first compression mode, a second N value (e.g., N=31) to provide a second compression mode, and a third N value (e.g., N=66) to provide a third compression mode.

Of the three modes, the first compression mode may provide a highest compression rate and a lowest compression quality, the third mode may provide a lowest compression rate and a highest compression quality, and the second mode may provide an intermediate compression rate and an intermediate compression quality. More or fewer than three user-selectable values of N and compression modes may be used.

Referring again to FIG. 4A, head table processor 418 may include logic to erase head table 428. In an implementation, head table processor 418 may erase head table 428 for each chunk processed by forward pass processor 410. In an implementation, head table processor 418 may erase head table 428 in its entirety in a single erase operation. As described above, in some implementations, head table 428 may have a size between about 2 GB and about 6 GB. Thus, erasing head table 428 in its entirety may take a significant amount of time (e.g., on the order of about 1 second for a 4 GB head table 428). To avoid this processing delay, in an implementation, head table processor 418 may selectively erase a portion of data in head table 428 on an as-needed basis.

In an implementation, head table processor 418 may include logic to associate an ID with each chunk processed. Thus, head table processor 418 may associate a first ID (e.g., "0001") with a first chunk of source data, a second ID (e.g., "0002") with a second chunk of source data, and so on, and may increment the ID by 1 with each chunk of processed source data.

FIG. 6C illustrates an example head table 428b that is similar to head table 428a of FIG. 6B, but also includes a column "ID" that lists an ID number associated with each trigram. As head table processor 418 processes each chunk to identify trigrams, head table processor 418 compares the ID associated with the chunk being processed to the ID associated with the trigram listed in head table 428b. If the ID listed in head table 428b is the same as the ID associated with the chunk being processed, head table processor 418 saves the position data for the trigram in head table 428b. If the ID listed in head table 428b differs from the ID associated with the chunk being processed, head table processor 418 erases the data for just that trigram in head table 428b.

For example, if head table manger 418 is starting processing a new chunk associated with ID 0021, and identifies trigram "abc" in the chunk, head table manger 418 finds a matching trigram "abc" associated with ID 0020 in head table 428b. Accordingly, head table manger 418 erases the data from trigram "abc" in head table 428b, saves the position of the identified trigram in column $P_0$, and changes the ID associated with trigram "abc" from 0020 to 0021. In this implementation, head table manger 418 does not erase any other data in head table 428b. Erasing only a portion of data in head table 428 may reduce processing time and increase the compression rate of source data.

Referring again to FIGS. 6A-6B, example head table 428a stores the actual value of the most recent position of each trigram. In an alternative implementation, a head table 428 may be compressed by storing position data as offsets between adjacent occurrences of each trigram. For example, FIG. 6D illustrates an example head table 428c that is similar to head table 428a of FIG. 6B, but stores position values as offsets from previous position values. By compressing data in head table 428c in this manner, a larger number N of most recent occurrences of each trigram may be saved in each head table 428. For example, whereas uncompressed head table 428a may store a maximum of N=66 occurrences for each trigram, compressed head table 428c may store a maximum of N=100 occurrences of each trigram. Other values of N may be used in compressed head tables 428. In this regard, compressing head table 428 may further facilitate hardware implementation of the LZMA compressor by reducing the time required to access head table 428.

Referring again to FIG. 4A, as head table processor 418 processes each byte in the chunk, head table processor 418 provides candidate match locations to match length processor 420. For example, referring to FIGS. 6A-6B, if the current encoding position is 19, head table processor 418 processes trigram "abc", and provides candidate match locations 0, 4 and 11 to match length processor 420. Likewise, if the current encoding position is 22, head table processor 418 processes trigram "3db", and provides candidate match location 14 to match length processor 420.

Referring again to FIG. 4A, match length processor 420 includes logic to determine a corresponding match length for each candidate match location received from head table processor 418. For example, referring again to FIGS. 6A and 6B, if the current encoding position is 19, match length processor 420 determines the following match lengths:

| Candidate Match Location | Match Length |
|---|---|
| 0 | 3 |
| 4 | 5 |
| 11 | 7 |

In particular, beginning at position 19, characters "abc" match three characters "abc" at candidate match location 0, characters "abc3d" match five characters "abc3d" at candidate match location 4, and characters "abc3dbc" match seven characters "abc3dbc" at candidate match location 11. Match length processor 420 includes logic to provide the candidate match locations and the corresponding determined match lengths to packet cost estimator 422.

Match length processor 420 includes a minimum match length MINLENGTH as the shortest match that will be considered and a maximum match length of MAXLENGTH characters as the longest match that will be considered. In an implementation, MINLENGTH=3 characters, although other values may be used. The MAXLENGTH value typically is at or above the maximum number of characters that back end processor 404 can encode. In an implementation, MAXLENGTH=273 characters, although other MAXLENGTH values may be used.

Referring again to FIG. 4A, as described above, forward pass processor 410 optionally may include first cache 426a, which may be used to store a portion of the chunk data (e.g., a most recent portion of the chunk), with the balance of the chunk data stored in source data chunk store 416. For example, if a chunk has a total size of 4 MB, first cache 426a may store the most recent 1 MB of chunk data, and source data chunk store 416 may store the remaining 3 MB of chunk data, or the entire 4MB of chunk data. In an implementation, match length processor 420 includes logic to access the most recent chunk data in first cache 426a or in source data chunk store 416. Because cache typically may be accessed faster than off-chip memory, this may reduce time required for match length processor 420 to access chunk data and determine match lengths. In another implementation, match length processor 420 includes logic to simultaneously access the most recent chunk data in first cache 426a and in source data chunk store 416. This also may reduce time required for match length processor 420 to access chunk data and determine match lengths.

Referring again to FIG. 6A, at position 19, the character string "abc3dbc" matches "abc3dbc" at candidate match location 11, which has a match length 7, and a distance 7. At position 20, the character string "bc3dbc" matches "bc3dbc" at candidate match location 12, which has a match length 6, and a distance 7. Likewise, at position 21, the character string "c3dbc" matches "c3dbc" at candidate match location 13, which has a match length 5, and a distance 7, and so on. Thus, when consecutive positions in the chunk (e.g., position i−1 and position i) have matches with the same distance, the match length of position i equals (match length of position (i−1)−1).

length processor 420 includes logic to calculate a distance to each candidate match for each position processed by match length processor 420, and store in second cache 426b the determined match length and calculated distance. If match length processor 420 identifies consecutive positions (e.g., position i−1 and position i) having the same calculated distance, match length processor 420 need not access source data chunk store 416 (or first cache 426a) to determine the match length of position i. Instead, match length processor 420 may subtract 1 from the determined match length of position i−1. This may further reduce the time required for match length processor 416 to determine match lengths.

Referring again to FIG. 4A, in an embodiment, dynamic program table processor 424 provides LONGREP(0)-LONGREP(3) values to match length processor 420. If head table processor 418 provides N candidate match locations to match length processor 420, there may be additional candidate match locations (e.g., if the number of candidate match locations is greater than N), but only the most recent N match locations are stored in head table 428. In an implementation, match length processor 420 includes logic to determine match lengths for possible matches at LONGREP(0)-LONGREP(3) locations in source data chunk store 416 for LONGREP distances greater than the longest match distance in head table 428.

If head table processor 418 provides fewer than N candidate match locations to match length processor 420, match length processor 420 need not wait for dynamic program table processor 424 to provide LONGREP(0)-LONGREP(3) values, because none of those distances can contain actual matches that are not in the candidates from head table processor 418.

Figure 7:
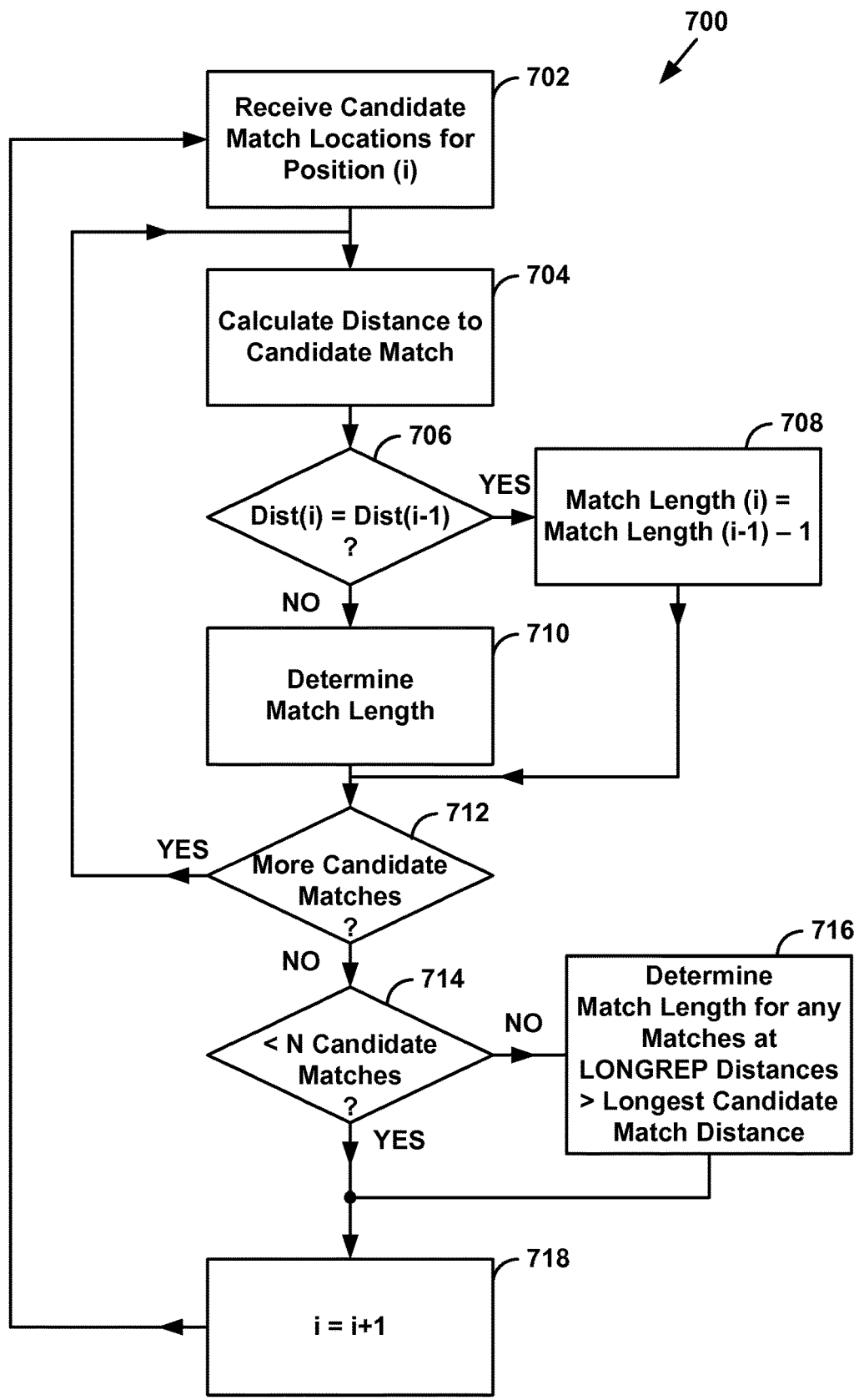
FIG. 7 is a flowchart that shows one manner of operation of a match length processor of the compression engines of FIGS. 4A-4B.

FIG. 7 is a process 700 that shows one manner of operation of match length processor 420. In block 702, match length processor 420 receives candidate match locations for position (i) of the chunk. For example, referring to FIGS. 6A-6B, if i=20, the trigram is bc3, and match length processor 420 receives candidate match locations 5 and 12. Recall that at position i−1=19, trigram abc has candidate match locations 0 (match distance 18 and match length 3), 4 (distance 14 and match length 5) and 11 (distance 7 and match length 7).

Referring again to FIG. 7, in block 704, match length processor 420 calculates a distance from position i to a first candidate match. For example, referring to FIGS. 6A-6B, match length processor 420 calculates a distance 14 to candidate match location 5.

Referring again to FIG. 7, in block 706, match length processor 420 determine if the distance calculated in block 704 matches a distance for position i−1. In this example, position i−1=19 also has a distance 14. Thus, at block 708, match length processor 420 calculates the match length for candidate match location 5 is 5−1=4. Alternatively, if the distance calculated in block 704 did not match a distance for position i−1, at block 710 match length processor 420 would calculate the match length for the candidate match.

At block 712, match length processor 420 determines if there are any more candidate matches to evaluate for position i. In this example, there is a second candidate match location 12, so match length processor 420 would loop back to block 704 for the second candidate match location. If there are no more candidate match locations, at block 714 match length processor 420 determines if the number of candidate matches is less than N, the maximum number of candidate matches per trigram in head table 428.

If there are N candidate matches, at block 716 match length processor 420 determines match lengths for any matches for any LONGREP(0)-LONGREP(3) locations that are at distances greater than the longest candidate match distance. At block 718, the value of i is incremented, and process 700 loops back to block 702, and match length processor 420 receives candidate match locations for position (i) of the chunk.

In an implementation, blocks 714-716 may be bypassed, and none of the LONGREP(0)-LONGREP(3) locations may be checked for matches. A consequence of not checking LONGREP(0)-LONGREP(3) locations may be a slightly lower compression factor, although the reduction in compression factor may be offset by a slightly faster compression rate, which may be an acceptable tradeoff in some implementations. Because of the operation of packet cost estimator 422, some LONGREPs can still be found.

Figure 8:
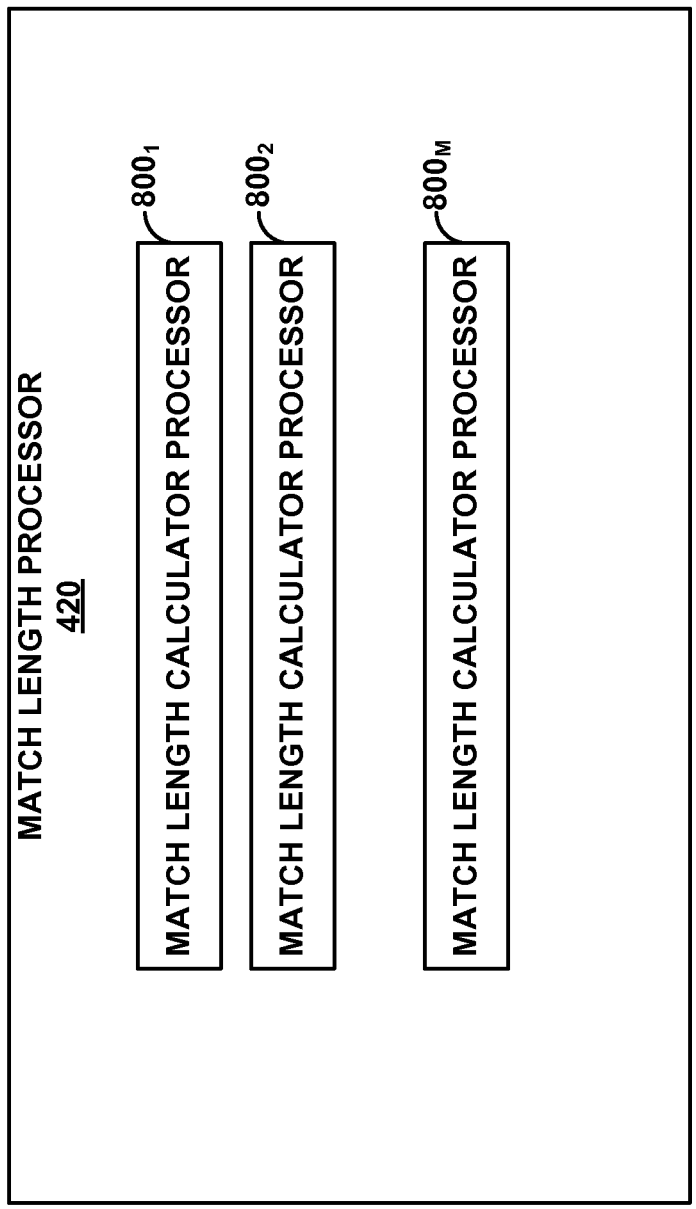
FIG. 8 is a block diagram illustrating an implementation of a match length processor of the compression engines of FIGS. 4A-4B.

FIG. 8 is a block diagram of an implementation of a match length processor 420. Match length processor 420 includes match length calculator processors $800_1, 800_2, \ldots, 800_M$ that include logic to simultaneously determine match lengths for multiple positions in the chunk. In particular, referring again to FIG. 4A, if head table processor 418 identifies multiple candidate match locations, head table processor 418 includes logic to simultaneously provide multiple candidate match locations to match length processor 420. Match length calculator processors $800_1, 800_2, \ldots, 800_M$ simultaneously determine match lengths for M candidate locations from head table and/or LONGREP locations. This may further reduce the time required for match length processor 420 to determine match lengths for candidate matches. In implementations, M may be between 2-6, although other M values may be used.

Referring again to FIG. 4A, match length processor 420 includes logic to provide candidate match locations and corresponding determined match lengths to packet cost estimator 422. There are often multiple ways to encode a given portion of a chunk. For example, there may be a variety of LONGREP and/or MATCH packets that may be used to encode a given portion of a chunk, and various combinations of LIT, MATCH and LONGREP packets may be used to encode up to a given position in a chunk. Determining a lowest cost way to encode a particular set of characters is complicated because the packets selected to encode one portion of a chunk can impact future encoding costs.

Packet cost estimator 422 receives candidate match locations and corresponding determined match lengths from match length processor 420, and includes logic to compute a cost of the various packets that may be used to encode each candidate match. For example, referring again to FIGS. 6A-6B, at position 19 of the chunk, the trigram "abc" has previous candidate matches at candidate match locations 0, 4 and 11, with corresponding match lengths of 3, 5 and 7, respectively. Thus, the portion of the chunk beginning at position 19 can be encoded using any of the following packets:

<LIT: a>
<MATCH length 3, distance 18>
<MATCH length 5, distance 14>
<MATCH length 11, distance 7>

In addition, there also may LONGREP packets that could be used instead of one or more of the three MATCH packets listed above. Each of these possible encodings has an associated cost in terms of a number of bits in the final compressed output.

Referring again to FIG. 4A, packet cost estimator 422 includes logic to compute a cost for each of the various packets that may be used to encode a LIT packet and MATCH/LONGREP packets that may be used for each candidate match. Dynamic program table processor 424 provides LONGREP(0)-LONGREP(3) values to packet cost estimator 422 to facilitate these cost calculations. For example, if head table 428 provides a candidate whose distance is 18, and dynamic program table processor 424 indicates this distance is the LONGREP(0) distance, packet cost estimator 422 can apply the lower LONGREP(0) cost to this packet.

Although an LZMA software algorithm uses a dynamically updated cost model to estimate the post-backend encoding cost, such a dynamically updated cost model would add a sequential dependency—estimating the cost of a packet requires finalizing earlier packets so that the cost model can be updated. To avoid this sequential dependency, packet cost estimator 422 uses a fixed cost model for the various fields of a packet. The fixed model uses static estimators of the cost of encoding packet headers, distances, lengths, and literal values, based on tuning data.

Packet cost estimator 422 provides the various packets and associated cost estimates to dynamic program table processor 424, which includes logic to determine "best last" (lowest cost) LZMA packets for each byte position in the chunk. In particular, packet cost estimator 422 determines a lowest cost set of packets to encode the data from MINLENGTH to MAXLENGTH positions from the current encoding point. In an implementation, dynamic program table processor 424 maintains dynamic program table 430 (e.g., in on-chip storage) that includes an entry for each position from MINLENGTH to MAXLENGTH positions from the current encoding point. As described above, in an implementation, MINLENGTH=3 and MAXLENGTH=273, although other values for each of MINLENGTH and MAXLENGTH may be used.

Figure 9:
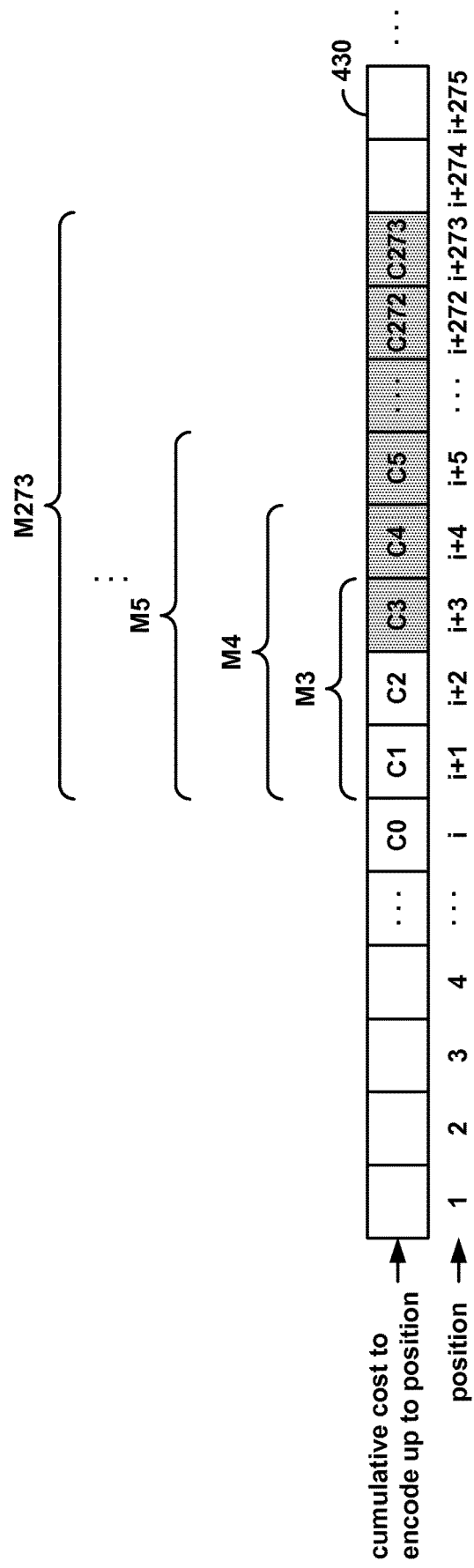
FIG. 9 is a diagram illustrating an implementation of a dynamic program table of FIGS. 4A-4B.

FIG. 9 illustrates an example dynamic program table 430 operating at current encoding point i, with candidate matches M3, M4, M5 . . . , M273 from MINLENGTH=3 to MAXLENGTH=273 positions from current encoding point i (shown highlighted in gray). For each position, dynamic program table processor 424 maintains in dynamic program table 430 a cumulative sum of an upper bound cost to encode up to each position, and maintains in a best (lowest cost) last packet store 432 (in memory 406) a final packet in that encoding sequence. Thus, in FIG. 9, the upper bound cost C3 at position i+3 equals the upper bound cost C0 at position i, plus the cost to encode candidate match M3. Likewise, the upper bound cost C4 at position i+4 equals the upper bound cost C0 at position i, plus the cost to encode candidate match M4, and so on.

As candidate matches are proposed, dynamic program table processor 424 may update the evaluated positions in dynamic programming table 430 with the cumulative sum based on the new match, or maintain the current value if the current value is better than the new potential encoding. Thus, in FIG. 9, if the current value of the cost at position i+5 is lower than the cost C5 calculated based on candidate match M5, dynamic program table processor 424 maintains the current value at position i+5.

If a match of length X and a distance Y encodes up to position Z, the chunk also includes a match of length X-1 and a distance Y that encodes up to position Z-1, a match of length X-2 and a distance Y that encodes up to position Z-2, and so on. Thus, in such a scenario, when dynamic program table processor 424 updates the upper bound cost at position Z, dynamic program table processor 424 includes logic to also update the cost at positions Z-1, Z-2, and so on back to MINLENGTH positions from the current encoding point.

FIGS. 10A-10B illustrate an example operation of dynamic program table processor 424. In FIG. 10A, dynamic programming table 430 shows that the current cost to encode up to position i is 7006, the current cost to encode up to position i+4 is 7071, and best last packet store 432 shows that the best last packet to encode position i+4 is <match length 6, dist 573>.

Dynamic program table processor 424 begins evaluating candidate matches beginning at position i. As illustrated in FIG. 10B, one candidate match M4 is <longrep(0), length 4>, which has a cost of 62 bits, and which encodes up to position i+4. Because the total cost 7006+62=7068 bits is less than the current value of 7071 bits, dynamic program table processor 424 updates position i+4 in dynamic programming table 430 with the cost 7068, and updates position i+4 best last packet store 432 with packet <longrep(0), length 5>.

Once all candidate matches for a given position in the chunk have been explored, head table processor 418, match length processor 420, and packet cost estimator 422 move on to the next position. Dynamic program table processor 424 shifts each position of data correspondingly in dynamic programming table 430, so that the best (lowest cost) at position k (which is k positions beyond the current search point) are moved to position k-1.

Figure 11A:
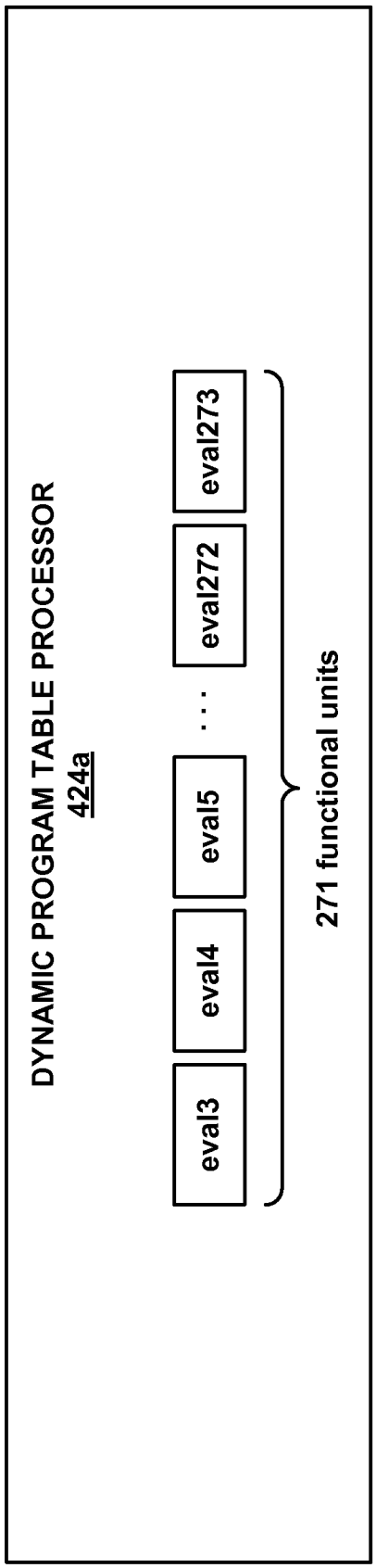
FIGS. 11A-11B are block diagrams illustrating implementations of dynamic program table processors of FIGS. 4A-4B.

FIG. 11A illustrates a block diagram of an implementation of dynamic program table processor 424a. In an implementation with MINLENGTH=3 and MAXLENGTH=273, dynamic program table processor 424a includes (MAXLENGTH-MINLENGTH+1)=271 separate functional units eval3, eval4, eval5, . . . , eval272, eval273 that each operate independently and in parallel. Each of functional units eval3, eval4, eval5, . . . , eval272, eval273 performs the evaluations described above for positions 3, 4, . . . , 272, 273 beyond the current encoding point. Persons of ordinary skill in the art will understand that if MINLENGTH and MAXLENGTH have values other than 3 and 273, respectively, dynamic program table processor 424a may have more or fewer than 271 functional units.

By way of example, if the current encoding point is i=79, functional unit eval4 compares the previous cost at position 83 of dynamic programming table 430 with the cost of a match length 4 from encoding point i. If functional unit eval4 determines that the previous cost at position 83 of dynamic programming table 430 is less than the cost of the match from encoding point i, functional unit eval4 leaves the previous cost at position 83 of dynamic programming table 430. Otherwise, functional unit eval4 replaces the previous cost at position 83 of dynamic programming table 430 with the (lower) the cost of the match length 4 from encoding point i, and saves the match length 4 packet (either a MATCH or a LONGREP packet) to the best last packet store 432.

Likewise, functional unit eval5 compares the previous cost at position 84 of dynamic programming table 430 with the cost of a match length 5 from encoding point i. If functional unit eval5 determines that the previous cost at position 84 of dynamic programming table 430 is less than the cost of the match from encoding point i, functional unit eval5 leaves the previous cost at position 84 of dynamic programming table 430. Otherwise, functional unit eval5 replaces the previous cost at position 84 of dynamic programming table 430 with the (lower) the cost of the match length 5 from encoding point i, and saves the match length 5 packet (either a MATCH or a LONGREP packet) to the best last packet store 432.

Each of functional units eval3, . . . , eval273 performs similar operations with respect to positions 81, . . . , 352, respectively, of dynamic programming table 430. Thus, each of functional units eval3, eval4, eval5, . . . , eval272, eval273 are hardware circuits that operate in parallel to maintain dynamic programming table 430.

In the example implementation of dynamic program table processor 424a, 271 separate functional units eval3, eval4, eval5, . . . , eval272, eval273 are used to maintain dynamic programming table 430. In some instances, dedicating such a large number of functional units to maintain dynamic programming table 430 may be too costly in terms of resources on compression engine 400a of FIG. 4A.

Figure 11B:
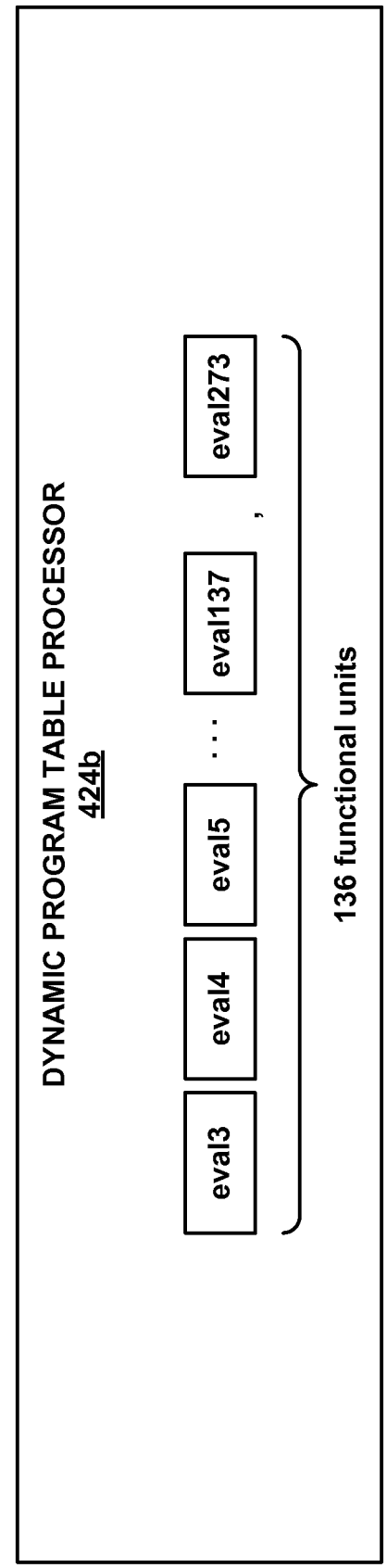

FIG. 11B illustrates a block diagram of an implementation of a dynamic program table processor 424b that uses fewer than (MAXLENGTH-MINLENGTH+1)=271 functional units as used in dynamic program table processor 424a of FIG. 11A. In particular, dynamic program table processor 424b includes 136 separate functional units eval3, eval4, eval5, . . . , eval137 and eval273 that each operate independently and in parallel. Each of functional units eval3, eval4, eval5, . . . , eval137 and eval273 performs the evaluations described above for positions 3, 4, 5, . . . , 137 and 273 beyond the current encoding point.

Dynamic program table processor 424b updates dynamic programming table 430 for matches of length 3, 4, 5, . . . , 137 and 273, but does not update dynamic programming table 430 for any matches of length 138 through 272. For example, dynamic program table processor 424b will not update dynamic programming table 430 for an entire match of length 157, but instead will only update dynamic program table 430 for a match of length 137 at a distance Y, and will either be a MATCH packet or a LONGREP(i) packet. Nevertheless, the engine will eventually find a LONGREP (0) of length 20 (157-137) at the same distance Y.

Thus, if dynamic program table processor 424b encounters a MATCH or a LONGREP(i) packet of distance Y and length L1, and the next consecutive position is a LONGREP (0) packet with a distance Y and a length L2, with L1+L2≤273, dynamic program table processor 424b or backward pass processor 412 can fuse the packets back together into a single packet having a distance Y and a length (L1+L2).

In the example implementation of FIG. 11B, dynamic program table processor 424b has 136 functional units eval3, eval4, eval5, . . . , eval137 and eval273 so that at most two packets will be needed to be fused to recreate a missing packet. Persons of ordinary skill in the art will understand that dynamic program table processor 424b may include fewer than 135 functional units, and thus more than two packets may be fused together to recreate missing packets.

Referring again to FIG. 4A, backward pass processor 412 includes a backtrack processor 434, which includes logic to perform a backtrack operation to find the best (lowest cost) overall encoding of the source data. Specifically, to encode a chunk of X bytes, if the best (lowest cost) final packet P to encode up through position X inclusive has a length of L, then the best (lowest cost) overall encoding is equal to the best (lowest cost) encoding of the file up through position (X-L) inclusive, with packet P tacked on to the end. This definition can be applied recursively to recover the best (lowest cost) overall encoding of the entire data. Thus, to find the best (lowest cost) encoding we start from the end of best (lowest cost) last packet store 432, find the length L of that packet (LIT packets have a length of 1), and backtrack identifying all of the packets contained in the best encoding.

This backtracking finds the subset of the best (lowest cost) last packet store 432 that is part of the best (lowest cost) encoding. There are multiple ways to hold this information. In one embodiment, the best (lowest cost) encoding is written to best packets store 436 (in memory 406) for use by range encoder 408a (or Huffman encoder 408b) of back end processor 404. In an alternative implementation, the backtracking can be maintained as a set of references into best last packet store 432, such as a set of pointers to packets that are part of the best (lowest cost) encoding.

Referring again to FIG. 4A, in an implementation, front end processor 402 and back end processor 404 are both implemented in one or more hardware accelerators, such as one or more FPGA, ASIC, GPU, MPPA, ASSP, SOC, CPLD, and/or custom integrated circuits devices. In other implementations, front end processor 402 is implemented in one or more hardware accelerators and back end processor 404 is implemented in software. In an implementation, LZMA compression engines, such as compression engines 400a and 400b of FIGS. 4Aa and 4B, respectively, are implemented in one or more hardware accelerators in a data center environment. In an implementation, forward pass processor 410 may be implemented in hardware, and back end processor 404 and backward pass processor 412 may be implemented in software.

Unless otherwise noted, all of the methods and processes described above may be embodied in whole or in part by software code modules executed by one or more general purpose computers or processors. The code modules may be stored in any type of computer-readable storage medium or other computer storage device. Some or all of the methods may alternatively be implemented in whole or in part by specialized computer hardware, such as FPGAs, ASICs, etc.

Conditional language such as, among others, "can," "could," "might" or "may," unless specifically stated otherwise, are used to indicate that certain examples include, while other examples do not include, the noted features, elements and/or steps. Thus, unless otherwise stated, such conditional language is not intended to imply that features, elements and/or steps are in any way required for one or more examples or that one or more examples necessarily include logic for deciding, with or without user input or prompting, whether these features, elements and/or steps are included or are to be performed in any particular example.

Conjunctive language such as the phrase "at least one of X, Y or Z," unless specifically stated otherwise, is to be understood to present that an item, term, etc., may be either X, or Y, or Z, or a combination thereof.

Many variations and modifications may be made to the above-described examples, the elements of which are to be understood as being among other acceptable examples. All such modifications and variations are intended to be included herein within the scope of this disclosure.

Illustrative Aspects of the Technology

The following summary provides a non-exhaustive list of illustrative aspects of the technology set forth herein.

According to a first aspect, a system is provided that includes a first processor and a second processor. The first processor includes first hardware logic circuitry that performs an LZMA forward pass compression process on a portion of source data to provide first output data. The second processor that performs an LZMA backward pass compression process on the first output data to provide second output data.

According to a second aspect, the first processor and/or the second processor includes one or more of a field programmable gate array device, an application-specific integrated circuit device, a graphics processing unit device, a massively parallel processor array device, an application-specific standard product device, a system-on-a-chip device, a complex programmable logic device, and a custom integrated circuit.

According to a third aspect, the second processor includes a software processor.

According to a fourth aspect, the first processor operates in parallel with the second processor.

According to a fifth aspect, the system further includes a third processor that performs a range encoder process or a Huffman encoder process on the second output data to provide compressed output data.

According to a sixth aspect, the third processor includes third hardware logic circuitry that performs the range encoder process or a Huffman encoder process.

According to a seventh aspect, the third processor includes a software processor.

According to an eighth aspect, the portion of source data includes a plurality of bytes, each byte including a corresponding position in the portion, and the first output data includes a lowest cost LZMA packet for each position in the portion of source data.

According to a ninth aspect, the second output data includes a plurality of lowest cost LZMA packets for the portion of source data.

According to a tenth aspect, a computing device is provided that includes a hardware accelerator that includes hardware logic circuitry that performs an LZMA forward pass compression process on a portion of source data. The hardware accelerator includes a head table processor that includes hardware logic circuitry that identifies trigrams in the portion of source data, and maintains in a memory a head table including N most recent occurrences of each identified trigram.

According to an eleventh aspect, the head table includes an array data structure.

According to a twelfth aspect, the head table includes a structure that allows bulk reads and bulk writes of data to the head table processor.

According to a thirteenth aspect, N is a fixed value.

According to a fourteenth aspect, N is a user-selectable value that may be used to provide multiple compression modes.

According to a fifteenth aspect, the head table processor maintains the head table in a compressed format.

According to a sixteenth aspect, the head table processor further includes hardware logic that selectively erases a portion of data in the head table.

According to a seventeenth aspect, a method is provided that includes using first hardware logic circuitry to perform an LZMA forward pass compression process on a portion of source data to provide first output data, using second hardware logic circuitry to perform an LZMA backward pass compression process on the first output data to provide second output data, and using third hardware logic circuitry to perform a range encoder process or a Huffman encoder process on the second output data to provide compressed output data.

According to an eighteenth aspect, the method further includes implementing one or more of the first hardware logic circuitry, the second hardware logic circuitry and the third hardware logic circuitry on one or more of a field programmable gate array device, an application-specific integrated circuit device, a graphics processing unit device, a massively parallel processor array device, an application-specific standard product device, a system-on-a-chip device, a complex programmable logic device, and a custom integrated circuit.

According to a nineteenth aspect, the portion of source data includes a plurality of bytes, each byte comprising a corresponding position in the portion, and the first output data includes a lowest cost LZMA packet for each position in the portion of source data.

According to a twentieth aspect, the second output data includes a plurality of lowest cost LZMA packets for the portion of source data.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A computing device comprising:
a hardware accelerator comprising hardware logic circuitry to perform a Lempel-Ziv-Markov chain algorithm (LZMA) forward pass compression process on a portion of source data, the hardware accelerator comprising:
a head table processor comprising hardware logic circuitry configured to identify consecutive sequences of two or more bytes in the portion of source data, and maintain in a memory a head table comprising N most recent occurrences of each identified consecutive sequences of two or more bytes, where N is either a fixed value or a user-selectable value that may be used to provide multiple compression modes.

2. The computing device of claim 1, wherein the head table comprises an array data structure.

3. The computing device of claim 1, wherein the head table comprises a structure that allows bulk reads and bulk writes of data to the head table processor.

4. The computing device of claim 1, wherein the head table processor maintains the head table in a compressed format.

5. The computing device of claim 1, wherein the head table processor further comprises hardware logic to selectively erase a portion of data in the head table.

6. The computing device of claim 1, wherein the hardware accelerator further comprises hardware logic circuitry to perform an LZMA backward pass compression process on an output data being output by the hardware logic circuitry performing the forward pass compression process on the portion of the source data.

7. The computing device of claim 1, wherein the portion of source data comprises a plurality of bytes, each byte having a corresponding position in the portion of source data, the hardware logic circuitry performing the forward pass compression process on the portion of the source data outputting a lowest cost LZMA packet for each position in the portion of source data.

8. The computing device of claim 7, wherein the hardware accelerator further comprises hardware logic circuitry to perform an LZMA backward pass compression process on a first output data being output by the hardware logic circuitry performing the forward pass compression process on the portion of the source data, the hardware logic circuitry performing the LZMA backward pass compression process outputting a second output data that comprises a plurality of lowest cost LZMA packets for the portion of source data.

9. The computing device of claim 1, wherein the hardware accelerator further comprises:
a match length processor comprising hardware logic circuitry configured to obtain, from the head table, candidate match locations for each identified consecutive sequence of two or more bytes, and calculate, from the obtained candidate match locations, lengths of candidate matches and distances to the candidate matches.

10. The computing device of claim 9, wherein the hardware logic circuitry of the match length processor that is configured to calculate the lengths of the candidate matches comprises hardware logic circuitry configured to generate a second candidate match length, of a second candidate match, by subtracting one from a first candidate match length, of a first candidate match, if a first and second positions are consecutive positions and if the first position has a same distance to the first candidate match as the second position has to the second candidate match.

11. The computing device of claim 9, wherein the match length processor further comprises multiple sets of hardware logic circuity, each set of hardware logic circuitry calculating, in parallel, the lengths of candidate matches and the distances to the candidate matches.

12. A hardware accelerator comprising hardware logic circuitry to perform a Lempel-Ziv-Markov chain algorithm (LZMA) forward pass compression process on a portion of source data, the hardware accelerator comprising:

a physical communicational connection that interfaces with a bus of a computing device; and a head table processor comprising hardware logic circuitry configured to identify consecutive sequences of two or more bytes in the portion of source data, and maintain a head table comprising N most recent occurrences of each identified consecutive sequences of two or more bytes, where N is either a fixed value or a user-selectable value that may be used to provide multiple compression modes.

13. The hardware accelerator of claim 12, wherein the head table comprises an array data structure.

14. The hardware accelerator of claim 12, wherein the head table comprises a structure that allows bulk reads and bulk writes of data to the head table processor.

15. The hardware accelerator of claim 12, wherein the head table processor maintains the head table in a compressed format.

16. The hardware accelerator of claim 12, wherein the head table processor further comprises hardware logic to selectively erase a portion of data in the head table.

17. The hardware accelerator of claim 12, wherein the portion of source data comprises a plurality of bytes, each byte having a corresponding position in the portion of source data, the hardware logic circuitry performing the forward pass compression process on the portion of the source data outputting a lowest cost LZMA packet for each position in the portion of source data.

18. The hardware accelerator of claim 12, further comprising:
a match length processor comprising hardware logic circuitry configured to obtain, from the head table, candidate match locations for each identified consecutive sequence of two or more bytes, and calculate, from the obtained candidate match locations, lengths of candidate matches and distances to the candidate matches.

19. The hardware accelerator of claim 18, wherein the hardware logic circuitry of the match length processor that is configured to calculate the lengths of the candidate matches comprises hardware logic circuitry configured to generate a second candidate match length, of a second candidate match, by subtracting one from a first candidate match length, of a first candidate match, if a first and second positions are consecutive positions and if the first position has a same distance to the first candidate match as the second position has to the second candidate match.

20. The hardware accelerator of claim 18, wherein the match length processor further comprises multiple sets of hardware logic circuity, each set of hardware logic circuitry calculating, in parallel, the lengths of candidate matches and the distances to the candidate matches.

21. A method of compressing source data comprising providing the source data to a hardware accelerator comprising hardware logic circuitry to perform a Lempel-Ziv-Markov chain algorithm (LZMA) forward pass compression process on at least a portion of the source data, the hardware accelerator comprising:

a head table processor comprising hardware logic circuitry configured to identify consecutive sequences of two or more bytes trigrams in the at least the portion of the source data, and maintain in a memory a head table comprising N most recent occurrences of each identified consecutive sequences of two or more bytes trigram, where N is either a fixed value or a user-selectable value that may be used to provide multiple compression modes.

\* \* \* \* \*